United States Patent [19]

Sandhu

[11] Patent Number: 5,173,438
[45] Date of Patent: Dec. 22, 1992

[54] METHOD OF PERFORMING A FIELD IMPLANT SUBSEQUENT TO FIELD OXIDE FABRICATION BY UTILIZING SELECTIVE TUNGSTEN DEPOSITION TO PRODUCE ENCROACHMENT-FREE ISOLATION

[75] Inventor: Gurtej S. Sandhu, Boise, Id.

[73] Assignee: Micron Technology, Inc., Boise, Id.

[21] Appl. No.: 656,365

[22] Filed: Feb. 13, 1991

[51] Int. Cl.[5] .......................................... H01L 21/76
[52] U.S. Cl. ........................................ 437/63; 437/28; 437/69; 437/245; 437/924; 148/DIG. 105
[58] Field of Search ............... 437/28, 29, 69, 931, 437/228, 245, 63, 924; 148/DIG. 76, DIG. 83, DIG. 105, DIG. 102

[56] References Cited

U.S. PATENT DOCUMENTS

| 4,679,303 | 7/1987 | Chen et al. | 357/23.11 |
| 4,789,648 | 12/1988 | Chow et al. | 156/653 |
| 5,010,039 | 4/1991 | Ku et al. | 437/228 |

FOREIGN PATENT DOCUMENTS

| 58-93250 | 6/1983 | Japan | 437/70 |
| 63-293850 | 11/1988 | Japan | 437/70 |

OTHER PUBLICATIONS

S. Sivaran et al. "Measurement and Modelling of Pattern Sensitivity During Chemical Mechanical Polishing of Interlevel Dielectrics" Oct. 8–10, 1991, University of California, Berkeley.
Carter W. Kaanta et al. "Dual Damascene: A ULSI Wiring Technology" 1991.
Wolf, S. et al, Silicon Processing for the VLSI Era, vol. 1, pp. 516 & 532, 1986.
Wolf, S. et al, Silicon Processing for the VLSIERA, vol. 2, pp. 246–252, 1990.
Ghandhi, S., VLSI Fabrication Principles, pp. 352, 1983.

Primary Examiner—George Fourson
Attorney, Agent, or Firm—Susan B. Collier

[57] ABSTRACT

An improved field implant process is disclosed wherein the field implant is performed after the field oxide isolation structure is fabricated by masking the active surface regions of the substrate with tungsten. The tungsten may be selectively deposited or blanket deposited. The energy of the field implant is controlled and adjusted to produce a maximum number of ions contiguous to a thinnest portion of field oxide with other portions being self-regulating.

24 Claims, 8 Drawing Sheets

METHOD OF PERFORMING A FIELD IMPLANT SUBSEQUENT TO FIELD OXIDE FABRICATION BY UTILIZING SELECTIVE TUNGSTEN DEPOSITION TO PRODUCE ENCROACHMENT-FREE ISOLATION

FIELD OF THE INVENTION

This invention relates generally to semiconductor devices, and more specifically to a process for the formation of the dopant influence in the substrate of a semiconductor integrated circuit.

BACKGROUND OF THE INVENTION

The trend in semiconductor device fabrication is toward increasing density of circuit components. As the function being implemented in the integrated circuit becomes more complex, an increasing number of devices including transistors, resistors, and the like, are required. These devices must, of course, be readily manufacturable and reliable. For a given chip size, an increase in the number of active circuit components requires that they be placed in close proximity to each other, thus forcing a corresponding reduction in the surface area of the circuit that can be occupied by electrical isolation structures. The demand to reduce the chip surface area consumed by electrical isolation structures, while maintaining the necessary electrical isolation of adjacent active components, has lead to the development of several different isolation schemes.

The most common isolation fabrication technique is a process known as localized oxidation of silicon (LOCOS), in which the substrate is oxidized to form an isolation structure. The oxidized substrate is referred to as field oxide. This process offers high reliability and proven high volume manufacturing compatibility. A major problem with this technique, however, is the loss of active surface area. A phenomenon known as lateral encroachment occurs wherein the final width of an electrical isolation structure is larger than the intended width defined by a patterned silicon nitride mask. The problem of lateral encroachment is shown in FIG. 1.

Shown in FIG. 1, in cross section, is a portion 5 of a semiconductor substrate 10 which has already undergone some of the processing steps used to fabricate an isolation structure using a standard LOCOS process in accordance with the prior art. A thick isolation oxide layer 12 has been formed in exposed portions of substrate 10. The oxidation has not occurred in regions of substrate 10 covered by a previously patterned composite layer of silicon nitride 14 overlying a thin layer of pad oxide 16. The lateral encroachment, commonly known as a bird's beak, is denoted in FIG. 1 by the distance labeled X. The degree of encroachment is often related to isolation oxide thickness near the edge of the nitride oxidation mask, denoted as H in FIG. 1, and the total oxide thickness denoted as $T_{OX}$. The oxidation under the nitride mask layer occurs when oxygen diffuses through the pad oxide layer 16 and reacts with the monocrystalline silicon substrate underlying the nitride layer 14.

Although field oxide physically prevents active regions from having electrical contact with each other it is also necessary to prevent parasitic conduction due to punchthrough and to eliminate stray transistor effects.

Punchthrough is the mergence of the source and drain regions of neighboring devices. The punchthrough phenomenon is more likely to begin to occur at lower voltages in lightly doped substrate.

Stray transistor effects occur when electric fields are induced in the isolation structure by voltages at metal contacts and/or conduction lines positioned over the isolation structures. The voltage at which the electric field overcomes the insulative quality of the field oxide is called the field threshold voltage. The metal contact simulates a transistor gate and unwanted currents flow in the substrate when the field threshold voltage is reached.

In most processes the resultant thickness of the field oxide has a direct relation to the area of the isolation region. That is, larger isolation regions typically engender thicker field oxide structures. As field isolation areas are made smaller a phenomenon referred to as the field-oxide thinning effect occurs. This is shown in portion 16 of substrate 17 in FIG. 2 by comparing thicker isolation structure 22 grown in a larger area of substrate 17 than thinner isolation structure 18 grown in a smaller area of substrate 17. The inconsistent thicknesses of the isolation structures in a device result in dissimilar threshold voltages throughout the device. Consequently, it is difficult to determine a consistent breakdown field parameter for the device as a whole.

In order to counteract the problems associated with punchthrough and stray transistor effects, a field implant is typically performed on the substrate. The field implant dopes the substrate below field oxide isolation structures. FIG. 3 shows portion 16 of substrate 17 and shows the initial processes involved in forming a doping layer of the prior art. A field implant 25 is performed on substrate 17. A field implant comprises a bombardment of the substrate in isolation regions with high energy ions in order to control the dopant influence of the substrate by forming a doping layer. The field implant normally requires two masking steps to implement either a p+ boron implant in an NMOS device or an n+ arsenic implant in a PMOS device. The masking resist 35 used to protect active regions of substrate 17 is removed after the field implant has been performed and the die is further fabricated to form isolation structures 18 and 22, FIG. 2, of field oxide. The field implant creates a channel-stop doping layer 40 under the field oxide.

Masking problems, ion diffusion and uncontrollable doping levels are inherent problems in the typical field implant calling for oxidation subsequent to the field implant.

The logistics of a typical photoresist mask with the required layerization, exposing, developing and etching contribute significantly to the processing cost of the semiconductor device.

The high temperatures present during an oxidation subsequent to the field implant result in diffusion of the implanted ions. The diffusion itself effectuates many problems. Relatively high boron or arsenic doses are necessary in order to achieve acceptable field threshold voltages, implying that the peak of the ion implant must be deep enough to avoid absorption by the growing field-oxide structure. High source/drain-to-substrate capacitances and reduced source/drain-to-substrate pn junction breakdown voltages are typical problems when channel-stop doping is too heavy.

Lateral diffusion is the encroachment into the active regions by the implanted dopant atoms. The lateral diffusion increases the surface ion concentration at the edge of the field oxide. This redistribution causes a loss of conductivity in the active area affected by diffusion, causing the transistor to simulate a narrower device. The diffusion necessitates larger active regions in order to maintain current capacity in transistor devices. Thus, decreasing diffusion increases circuit density.

Adjusting the doping level to compensate for a thinner isolation structure could contribute significantly to a uniform field threshold voltage. However, when the field implant is prior to oxidation, the substrate is uniformly doped regardless of the field oxide thickness. That is, the field oxide will have no effect on the dopant influence. Therefore, inconsistent field threshold voltages will still be present.

BRIEF SUMMARY OF THE INVENTION

The preferred embodiment of the present invention replaces the field implant prior to oxidation with a field implant subsequent to oxidation by using a selective tungsten deposition to mask the active regions during the field implant.

A selective deposition is characterized by the controlled deposit and accumulation of a substance in specific and predetermined regions of a semiconductor wafer. Processing steps are eliminated by utilizing a selective deposition in place of a blanket deposition. The blanket deposition completely overlays the entire semiconductor wafer and requires at least an additional etch to remove the deposition protecting the isolation regions. In the case of the present embodiment, tungsten is initially deposited on exposed silicon and is subsequently deposited on the tungsten previously deposited.

Tungsten is used as a mask since its large atomic mass ingenerates a high stopping power for all implanted species used in semiconductor fabrication. Stopping power is the ability of a material to inhibit ion penetration. For example, in the case of a 100 keV boron implantation, the ions are blocked in tungsten having a thickness of about 990 Å whereas a thickness of about 6100 Å of silicon dioxide is required to block ions having the same energy. Therefore, tungsten films about one-sixth the thickness of silicon dioxide can block these implants in the active areas.

The field implant of the present embodiment eliminates masking steps, controls lateral diffusion and lateral encroachment, and provides identical field threshold voltages throughout the semiconductor circuit.

Since there are no high temperatures present when the field implant is performed after field oxidation, there is no diffusion of the implanted ions. Consequently, an increased dopant influence can be used in conjunction with a thinner field oxide thus reducing the lateral encroachment and bird's beak. Therefore the advantage is two-fold: diffusion problems are eliminated and lateral encroachment problems are reduced.

One significant advantage of oxidation prior to field implant is the self-correcting manner in which the field oxide regulates the dopant influence. The regulation can be better understood by analyzing FIG. 4 depicting the graphical relationship of the thickness of the field oxide versus the number of ions implanted in a substrate through the field oxide at a given energy level. It can be seen from the graphs that initially, as the oxide increases in thickness, the number of ions implanted increases to a certain peak. At the peak an increase in oxide thickness results in a decrease in the number of ions implanted. The energy of the field implant can be adjusted and controlled to maximize this relationship and eliminate the effects of field thinning. For example, if the field implant is adjusted to utilize the peak of the ion bombardment for the thinnest field oxide structure, thicker oxide structures will limit the number of ions implanted according to the graphical relationship. In FIG. 4, a thickness 45 allows peak implant 50 while the number of ions are reduced to 55 for an oxide thickness 60. This self-adjustment is also applicable to individual oxide structure 65 shown in portion 66 of substrate 17, FIG. 5. The peak ion implantation can be adjusted to the thinnest point 70 and the ion implant through the structure will be self-regulating to form a self-adjusted dopant layer 71, having a less dense ion concentration directly beneath the field oxide 65 at its thickest portion with the density of the ion concentration increasing toward point 70 as the thickness of the oxide structure tapers toward point 70. The tungsten 72 shields the substrate in the active regions from the ion bombardment. The final result will be a uniform field threshold voltage across the chip. Potentially, this method can be utilized to counter the field thinning effects. Through the proper choice of implant energy and dose, the doping concentration below the field oxide can be adjusted in a self-correcting manner to result in a uniform breakdown voltage across the chip.

BRIEF DESCRIPTION OF THE DRAWINGS

FIG. 6 is a cross sectional view of a portion of a partially-processed semiconductor wafer which depicts the wafer following the masking and subsequent etching of a nitride layer thereby exposing an initial thin oxide layer.

FIG. 7 is a cross sectional view of the wafer portion of FIG. 6 following the thermal oxidation of the substrate in the isolation regions and the removal the remaining nitride layer and photoresist and the removal of the initial oxide layer.

FIG. 8 is a cross sectional view of the wafer portion of FIG. 7 following a selective tungsten deposit in active surface regions.

FIG. 9 is a cross sectional view of the wafer portion of FIG. 8 following the formation of a channel-stop doping layer.

FIG. 10 is a cross sectional view of the wafer portion of FIG. 9 following the removal of the tungsten.

FIGS. 10 through 12 illustrate, in cross section, process steps in accordance with an alternative embodiment of the invention.

DETAILED DESCRIPTION OF THE PREFERRED EMBODIMENTS

Figure 1:
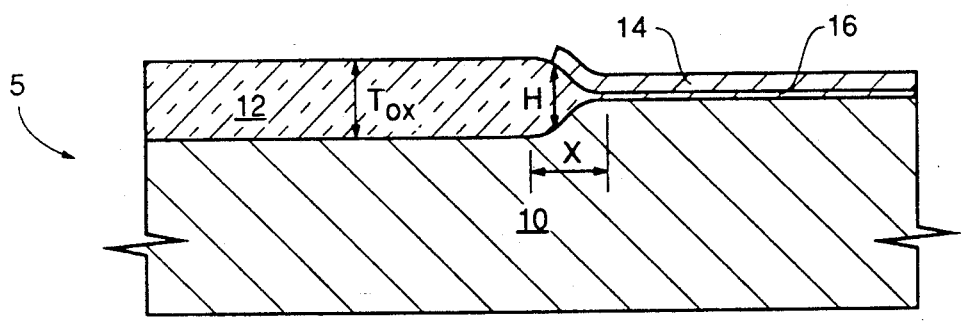
FIG. 1 illustrates, in cross section, a portion of a semiconductor device according to the prior art.
Figure 2:
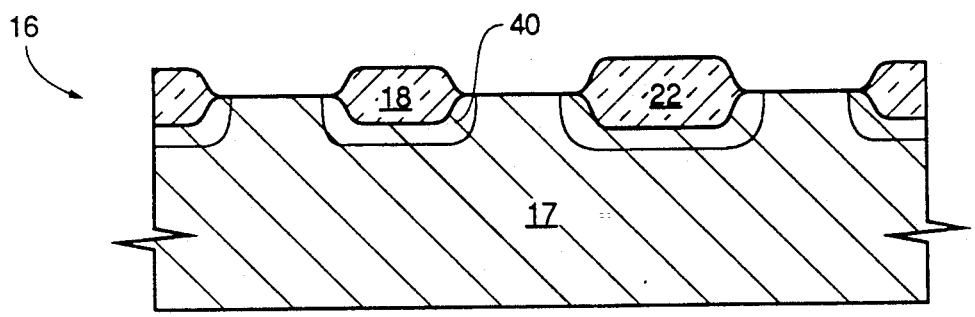
FIGS. 2 through 3 illustrate, in cross section, process steps in accordance with the prior art.
Figure 3:
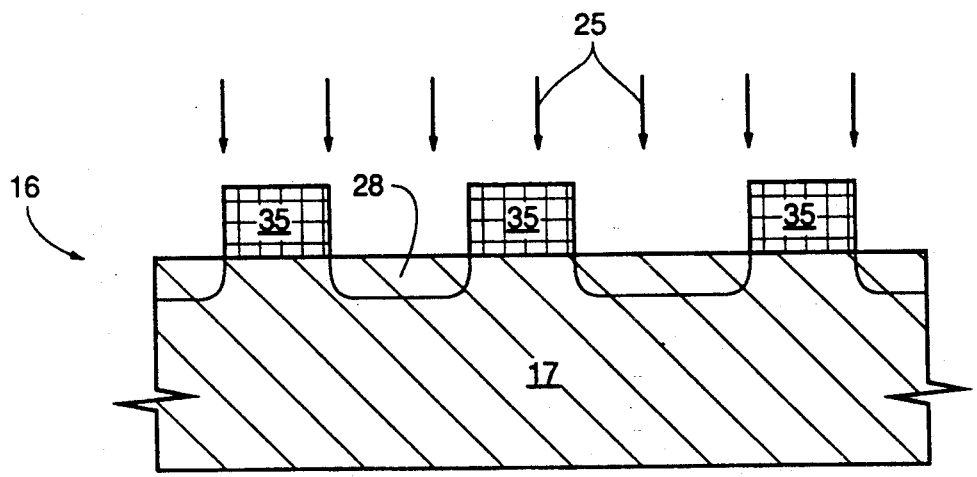
Figure 4:
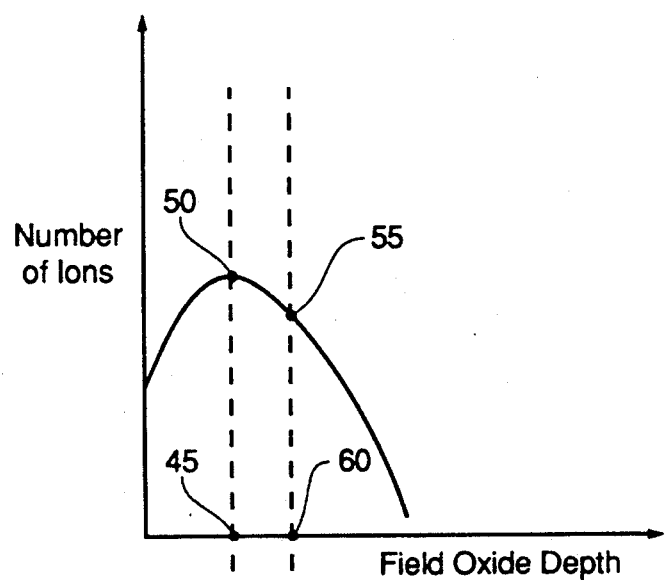
FIG. 4 graphically illustrates the relationship of field oxide depth versus the number of ions implanted.
Figure 5:
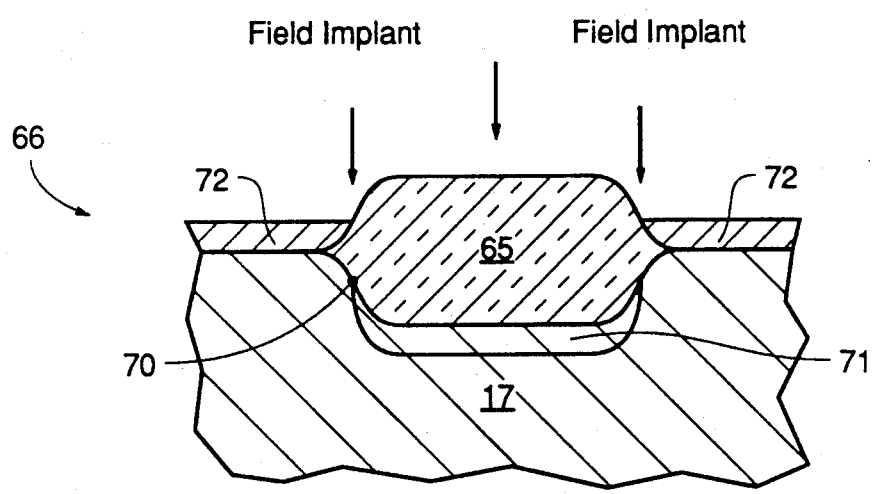
FIG. 5 illustrates, in cross section, a single field oxide isolation structure and contiguous dopant layer.

FIGS. 6 through 9 illustrate, in cross section, process steps in accordance with the preferred embodiment of the invention wherein a field implant is performed in a monocrystalline silicon substrate to form a channel-stop doping layer in an integrated circuit.

Initially, field oxide electrical isolation structures are formed using a wet oxidation process. The wet oxidation typically comprises growing a thin layer or depositing a thin layer of initial oxide 73 to overly the substrate 74, followed by a blanket deposition of nitride 75. Active surface regions 80 are defined with photoresist 81 and the nitride 75 is etched overlying future isolation regions 82 thereby exposing the initial oxide 73 in the isolation regions 82. The result of performing these steps is shown pictorially in FIG. 6.

At this point, the substrate may be subjected to an n well implant in order to define n wells in the active area or a p well implant in order to define p wells in the active area. The implants utilize a dopant which is selected to diffuse to a depth which defines the well. Conventionally, this step is a high energy implant, with phosphorous often chosen as an implant material for forming the n well implant because of its favorable diffusion coefficient. Alternatively, a combination of phosphorous and arsenic has been used. The use of arsenic improves the definition of the n wells and reduces short channel effects in p channel transistors. Boron is typically used to form a p well implant.

Next the photoresist 81 is removed and a steam or thermal oxidation step is used to form an oxide isolation structures 83 in the isolation regions 82. The heat generated during the oxidation diffuses the ions previously implanted. After the steam oxidation step the nitride 75 and the initial oxide 73 are removed from the active surface regions 80 and the substrate is exposed. The result of performing these steps is shown pictorially in FIG. 7.

Although the preceding steps may vary in efforts to minimize the birds beak formed as a result of this process the actual implementation utilized to form the thermally formed oxide isolation structures is not critical to the preferred embodiment.

Figure 6:
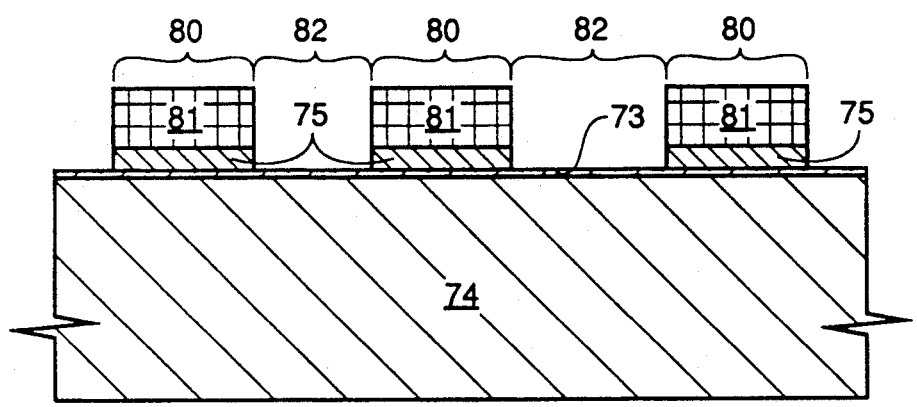
FIGS. 6 through 10 illustrate, in cross section, process steps in accordance with a preferred embodiment of the invention.
Figure 7:
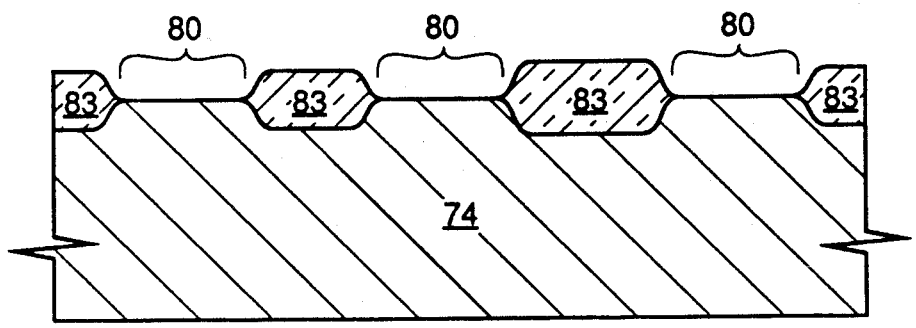

Initially, field oxide electrical isolation structures are formed using a wet oxidation process. An isotropic wet chemical etch is then employed to remove masking layers from the active regions in order to expose the substrate. The resultant isolation structures 75 and active surface regions of exposed substrate 80 are depicted in FIG. 6, FIG. 6 illustrating, in cross section, a portion 82 of substrate 17.

Figure 8:
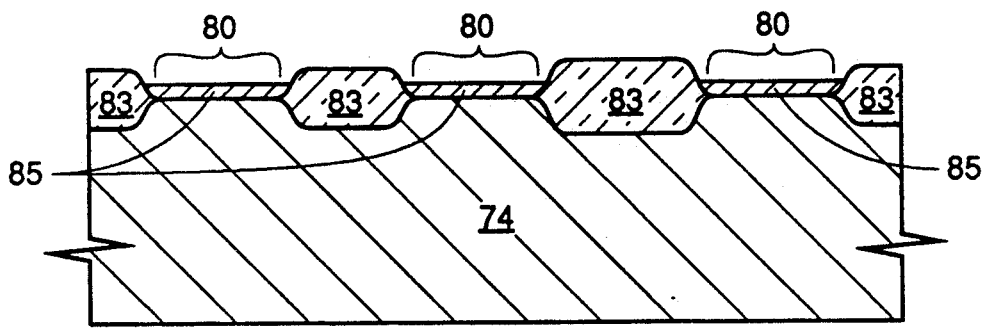

A selective tungsten deposition is then performed, as depicted in FIG. 8, to provide a tungsten layer 85 overlying the active surface region 80 of the substrate 84. The tungsten deposition is performed according to methods well known in the art and provides an initial deposit and accumulation of tungsten on the exposed substrate with subsequent deposits accumulating on the previously deposited tungsten. During the selective tungsten deposition the field oxide isolation structures 83 remain exposed.

Figure 9:
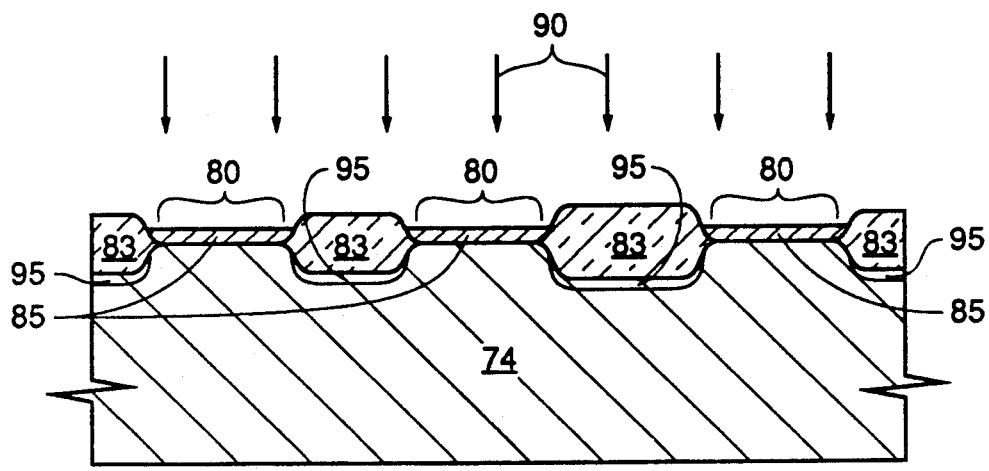

The process is continued, as shown in FIG. 9, with a field implant 90 performed to provide a channel-stop doping layer 95 in the substrate contiguous to the field oxide isolation structures 83. It is possible for the field implant to comprise independent bombardments of the substrate with different energy levels. In any case the energy of the field implant is selected to allow ion penetration of the field oxide, and to provide a peak implant having a maximum concentration of ions contiguous to a thinnest portion of the isolation structures formed in the substrate. With the peak implant pertinent to the thinnest isolation structure, the implant is self-adjusting to the thicker oxide structures. That is, the ion density of the dopant layer decreases in regions where the field oxide increases in thickness.

The field implant comprises n+ arsenic ions to isolate regions of p type semiconductor material and p+ boron ions to isolate regions of n type semiconductor material. The field implant 90 thus creates a channel stop doping layer 95 as shown in FIG. 9.

The process is completed with the removal of the tungsten from the active regions by a standard tungsten isotropic wet chemical etch well known to those in the art. Typically the wet etch solution comprises ammonium hydroxide or a mixture of ammonium hydroxide and hydrogen peroxide.

Figure 10:
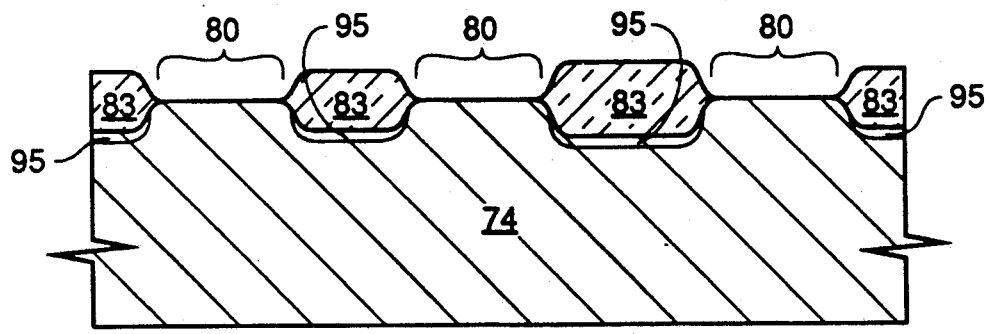

FIG. 10 is a final pictorial of the semiconductor active surface regions 80 effectively isolated by an improved field oxide structure 83 and improved channel-stop doping layer 95.

Figure 11:
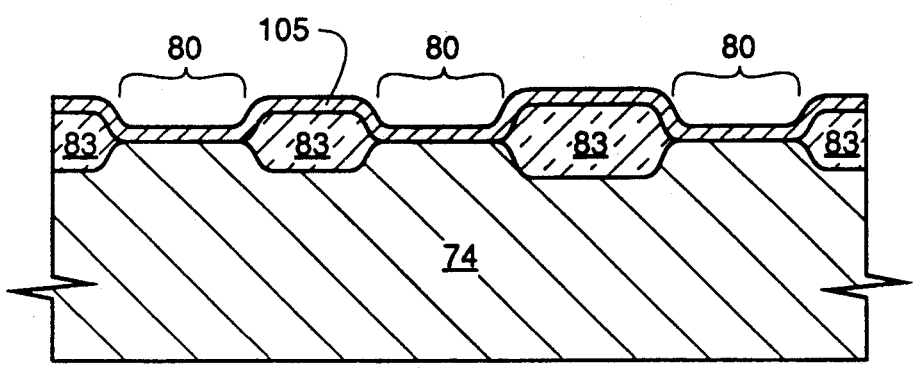
Figure 12:
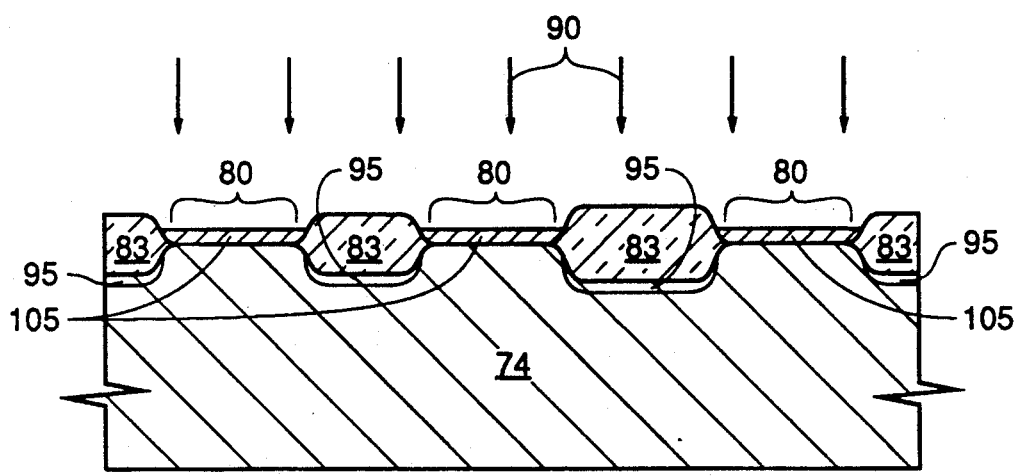
Figure 13:
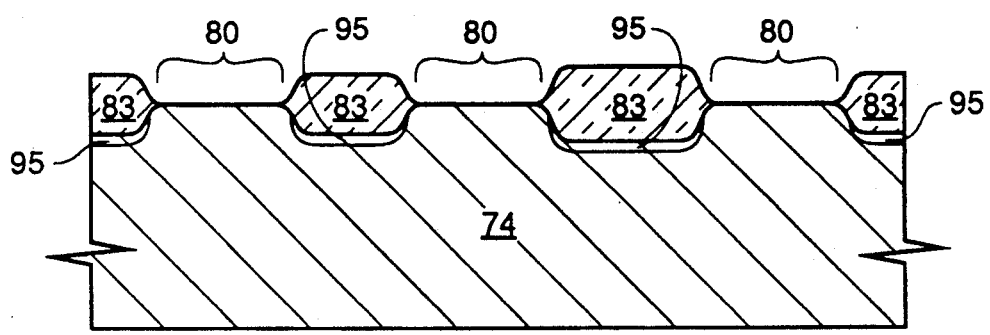

An alternative embodiment of the present invention is illustrated, in cross section, in FIGS. 11 through 13 as portion 100 of semiconductor substrate 84. For clarity, elements the same as those previously described have retained the same number.

In the alternative embodiment, shown in FIG. 11, the electrical isolation structure of field oxide 83 and the active surface regions 80 are covered by blanket depositing a layer of tungsten 105. The field oxide 83 is exposed using an anisotropic mechanical dry etch to remove the layer of tungsten overlying the field oxide. The active surface regions 80 remain covered by the layer of tungsten 105, illustrated in FIG. 12.

One type of anisotropic mechanical dry etch is known as Chemical Mechanical Polishing (CMP). It is conceivable that other methods may be developed; however, at this time CMP is preferred. The article by S. Sivaran et al. "Measurement and Modelling of Pattern Sensitivity During Chemical Mechanical Polishing of Interlevel Dielectrics", published in "Advanced Metallization for ULSI Applications" (Oct. 8-10, 1991, University of California, Berkeley describes CMP. The article states "The CMP process for the planarization of interlevel dielectrics proceeds by moving the patterned wafer with respect to a polishing pad while applying a polishing pressure between the wafer and the pad. The pad is saturated with a polishing slurry which acts as the polishing medium." The article by Carter W. Kaanta et al. "Dual Damascene: A ULSI Wiring Technology" published in "1991 VLSI Multilevel Interconnection Conference" describes the application of CMP to the Dual Damascene process and is equally applicable to etching the blanket deposition of tungsten of the invention.

In accordance with the alternative embodiment of the invention, the previously described field implant 90 is carried out to form a channel-stop doping layer 95, as illustrated in FIG. 12.

In FIG. 13, the tungsten has been removed to form active surface regions isolated one from another by the electrical isolation structure of field oxide 83 and the channel-stop doping layer 95.

Whether the process is implemented with a blanket tungsten deposition or a selective tungsten deposition, the process of the present embodiment requires substantially fewer steps then the processes implement with a conventional photoresist mask. By decreasing the processing steps a substantial savings is realized, both from a time and a materials standpoint.

Tungsten may be replaced in either the preferred embodiment or the alternate embodiment with any dense material. A dense material is defined as a material having the capability to inhibit ion penetration greater than the capability of an electrical isolation structure to inhibit an ion penetration for an ion bombardment of equivalent energies. For example, tungsten may be replaced with a nobel metal or another refractory metal. More specifically, tungsten may be replaced with copper, platinum, palladium, silver or gold.

In addition to the cost savings, the product, a semiconductor substrate having active surface regions isolated one from another by field oxide and a channel-stop doping layer implanted subsequent to the fabrication of the field oxide isolation structure by using a tungsten layer to shield the substrate, allows for dense placement of active surface regions. The product is characterized first by field oxide regions having minimal bird's beak encroachment because of the thinner field oxide required in the process. Secondly, the product is characterized by channel-stop doping layer self-regulated to provide the optimal substrate doping influences contiguous to any given point of field oxide. Third, there is no diffusion of the doping layer since the field implant was implemented after the field oxide was grown, and thus the myriad problems associated with diffusion are also eliminated. Finally, the product is characterized by consistent breakdown parameters. Due to the self-regulation nature of the field implant, the breakdown threshold voltages remain uniform across the device.

Thus, it is apparent that there has been provided, in accordance with the invention, an improved process for forming electrical isolation structures which fully meets the objects and advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

What is claimed is:

1. A method for forming an integrated circuit device on a semiconductor substrate comprising the steps of:
   a. forming at least one electrical isolation structure in said substrate, said electrical isolation structure formed in an isolation region while being substantially prevented from being substantially simultaneously formed in an active region;
   b. exposing said substrate in said active region while retaining said electrical isolation structure;
   c. depositing a layer of dense material to overlie said substrate in said active region while substantially preventing a depositing of said layer of dense material to overlie said electrical isolation structure thereby providing a self-alignment of said dense material to said active region, said dense material having a capability to inhibit an ion penetration greater than the capability of said electrical isolation structure to inhibit said ion penetration; and
   d. subjecting said electrical isolation structure, said layer of dense material, and said substrate to an ion bombardment having at least sufficient energy for ion penetration of said electrical isolation structure, said layer of dense material shielding said active region of said substrate from said ion bombardment, and said ion bombardment forming a doping layer contiguous to said isolation structure in said substrate.

2. The method of claim 5, wherein said depositing said layer of dense material is selective to said active region over said electrical isolation structure as a result of controllably adjusting a chemical reaction rate of said layer of dense material with respect to said electrical isolation regions and controllably adjusting a chemical reaction rate of said layer of dense material with respect to said substrate in said active region and with respect to an initial deposition of said layer of dense material deposited on said substrate in said active region.

3. The method of claim 1, wherein said exposing comprises an isotropic wet chemical etch.

4. The method of claim 1, further comprising controlling and regulating said ion bombardment to provide a doping layer having a maximum concentration of ions contiguous to a thinnest portion of said electrical isolation structure in order to provide a self-adjusting ion implant thereby increasing the concentration of dopant in said doping layer at the locations where said electrical isolation structure is thinner.

5. The method of claim 1, wherein said layer of dense material is a refractory metal.

6. The method of claim 1, wherein said layer of dense material is a noble metal.

7. The method of claim 1, wherein said layer of dense material is selected from the group consisting of tungsten, copper, platinum, palladium, silver and gold.

8. The method of claim 1, further comprising removing said layer of dense material subsequent to said ion bombardment.

9. The method of claim 8, wherein said removing further comprises isotropically etching said layer of dense material with an etch solution selected from the group consisting of ammonium hydroxide and a mixture of ammonium hydroxide and hydrogen peroxide.

10. The method of claim 1, wherein said electrical isolation structure comprises field oxide.

11. The method of claim 1, wherein said depositing of said layer of dense material comprises selectively depositing tungsten to overlie said substrate in said active region while substantially preventing said tungsten form being deposited on said electrical isolation structure.

12. The method of claim 1, wherein said subjecting further comprises bombarding said substrate with boron ions to isolate n type regions of said substrate.

13. The method of claim 1, wherein said subjecting further comprises bombarding said substrate with arsenic ions to isolate p type regions of said substrate.

14. A method for forming a semiconductor device comprising the steps of:
   a. providing a substrate having active surface regions;
   b. forming at least one electrical isolation structure of field oxide in said substrate to isolate said active surface regions one from another, said electrical isolation structure formed in an isolation region while being substantially prevented from being substantially simultaneously formed in an active region;
   c. exposing said substrate in said active surface regions while retaining said field oxide;
   d. depositing a layer of tungsten to overlie said substrate in said active surface regions while substantially preventing a depositing of said tungsten to overlie said field oxide thereby providing a self-alignment of said tungsten to said active regions; and
   e. subjecting said substrate, said field oxide and said layer of tungsten to an ion bombardment having at least sufficient energy for ion penetration of said field oxide, said layer of tungsten shielding said active surface regions, and said ion bombardment forming a doping layer contiguous to said field oxide in said substrate.

15. The method of claim 14, wherein said depositing said layer of tungsten is selective to said active surface regions over said field oxide as a result of controllably adjusting a chemical reaction rate of said layer of tungsten with respect to said field oxide and controllably adjusting a chemical reaction rate of said layer of tungsten with respect to said substrate in said active surface regions and with respect to an initial deposition of said layer of tungsten on said substrate in said active surface regions.

16. The method of claim 14, wherein said exposing comprises an isotropic wet chemical etch.

17. The method of claim 14, wherein the method further comprises removing said layer of tungsten subsequent to said high energy ion bombardment.

18. The method of claim 17, wherein said removing comprises isotropically etching said layer of tungsten with an etch solution selected from the group consisting of ammonium hydroxide and a mixture of ammonium hydroxide and hydrogen peroxide.

19. The method of claim 14, further comprising controlling and regulating said ion bombardment to provide a doping layer having a maximum concentration of ions contiguous to a thinnest portion of said field oxide.

20. The method of claim 14, wherein said subjecting further comprises bombarding said substrate with arsenic ions to isolate p type regions of said substrate.

21. The method of claim 14, wherein said subjecting further comprises bombarding said substrate with boron ions to isolate n type regions of said substrate.

22. The method of claim 1, wherein said forming further comprises:
  a) forming a barrier layer to overly said substrate;
  b) patterning said barrier layer with photoresist in order to protect said active region during a future etch;
  c) etching said barrier layer to expose said substrate in said isolation region;
  d) removing said photoresist;
  e) thermally oxidizing said substrate to form said isolation structure; and
  f) removing said barrier layer to expose said substrate in said active region while retaining said electrical isolation structure.

23. The method of claim 22, further comprising forming an initial thin oxide layer to overlie said substrate, said forming of said initial thin oxide layer performed prior to said forming said barrier layer thereby providing a receptive surface for said barrier layer.

24. The method of claim 22, wherein said barrier layer is a nitride.

* * * * *

UNITED STATES PATENT AND TRADEMARK OFFICE
CERTIFICATE OF CORRECTION

PATENT NO. : 5,173,438
DATED : December 22, 1992
INVENTOR(S) : Gurtej S. Sandhu

It is certified that error appears in the above-indentified patent and that said Letters Patent is hereby corrected as shown below:

Column 4, line 44, after "removal," please insert -- of --

Column 7, line 4, delete "nobel" and insert -- noble --;

Column 7, line 65, delete "5" and insert -- 1 --;

Column 8, line 28, please delete "further".

Signed and Sealed this

Ninth Day of November, 1993

Attest:

BRUCE LEHMAN

Attesting Officer    Commissioner of Patents and Trademarks